(12) United States Patent
Kang et al.

(10) Patent No.: US 9,811,712 B2
(45) Date of Patent: Nov. 7, 2017

(54) INTENSIFIED SENSOR ARRAY FOR STATIC ELECTRICITY

(75) Inventors: Moon Hyo Kang, Seoul (KR); Ji Ho Hur, Yongin-si (KR); Hyo Jun Kim, Yongin-si (KR); Bong Yeob Hong, Hwaseong-si (KR)

(73) Assignee: SILICON DISPLAY TECHNOLOGY, Yongin-si (KR)

( * ) Notice: Subject to any disclaimer, the term of this patent is extended or adjusted under 35 U.S.C. 154(b) by 655 days.

(21) Appl. No.: 14/376,896

(22) PCT Filed: Jun. 22, 2012

(86) PCT No.: PCT/KR2012/004943
§ 371 (c)(1),
(2), (4) Date: Aug. 6, 2014

(87) PCT Pub. No.: WO2013/058464
PCT Pub. Date: Apr. 25, 2013

(65) Prior Publication Data
US 2015/0084038 A1    Mar. 26, 2015

(30) Foreign Application Priority Data
Oct. 21, 2011   (KR) .................. 10-2011-0107856

(51) Int. Cl.
*G06F 3/041* (2006.01)
*G06K 9/00* (2006.01)
(Continued)

(52) U.S. Cl.
CPC ......... *G06K 9/00053* (2013.01); *G01B 7/003* (2013.01); *G06K 9/0002* (2013.01);
(Continued)

(58) Field of Classification Search
CPC ....... H01L 21/02107; G06F 3/041; G09F 3/36
(Continued)

(56) References Cited

U.S. PATENT DOCUMENTS 5,233,448 A * 8/1993 Wu .................. G02F 1/136204
257/452
5,585,817 A * 12/1996 Itoh ...................... G02F 1/1354
345/104

(Continued)

FOREIGN PATENT DOCUMENTS

| JP | 2002-094041 A | 3/2002 |
| KR | 10-2005-0015581 A | 2/2005 |
| KR | 10-0870013 B1 | 11/2008 |

OTHER PUBLICATIONS

Written Opinion dated Dec. 4, 2012 for Application No. PCT/KR2012/004943.

(Continued)

*Primary Examiner* — Dharti Patel
(74) *Attorney, Agent, or Firm* — Frost Brown Todd LLC

(57) ABSTRACT

Provided is a intensified sensor array for static electricity having a structure in which a static electricity preventing wiring covers an upper surface of a pixel circuit to cut off static electricity, so when static electricity of a high voltage is momentarily generated, the static electricity induced through the static electricity preventing wiring is discharged, thereby being capable of effectively protecting the pixel circuit of a lower part from the static electricity.

18 Claims, 4 Drawing Sheets

(51) Int. Cl.
*G01B 7/00* (2006.01)
*H01L 23/60* (2006.01)
*H01L 27/02* (2006.01)
*H01L 27/12* (2006.01)

(52) U.S. Cl.
CPC .......... *H01L 23/60* (2013.01); *H01L 27/0251* (2013.01); *H01L 27/124* (2013.01); *H01L 2924/0002* (2013.01)

(58) Field of Classification Search
USPC ..................................... 257/43, 59; 361/220
See application file for complete search history.

(56) References Cited

U.S. PATENT DOCUMENTS

| | | | |
|---|---|---|---|
| 7,379,139 B2 * | 5/2008 | Yamazaki | G02F 1/1362 345/104 |
| 2004/0135953 A1 * | 7/2004 | Lee | G02F 1/1339 349/141 |
| 2012/0105337 A1 * | 5/2012 | Jun | G06F 3/0412 345/173 |
| 2012/0113027 A1 * | 5/2012 | Song | G06F 3/0412 345/173 |

OTHER PUBLICATIONS

English Abstract of Patent Application No. JP 2002-0914041.
English Abstract of Patent Application No. KR 10-2005-0015581.
English Abstract of Patent Application No. KR 10-0870013.

* cited by examiner

[Fig. 1] - PRIOR ART
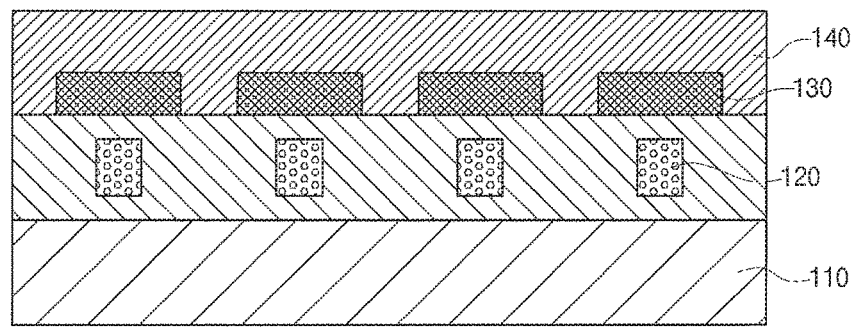
[Fig. 2] - PRIOR ART
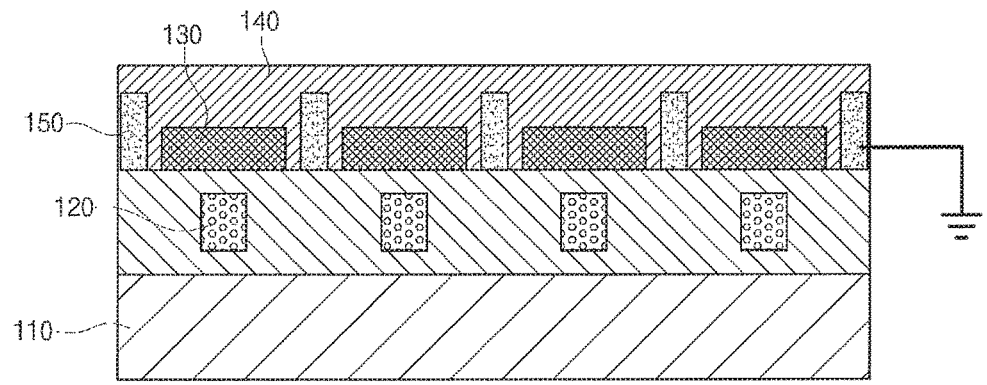
[Fig. 3] - PRIOR ART
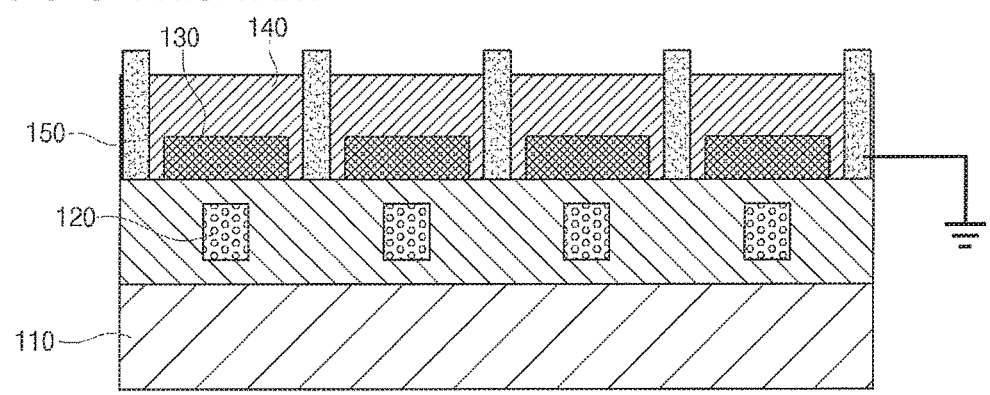
[Fig. 4]
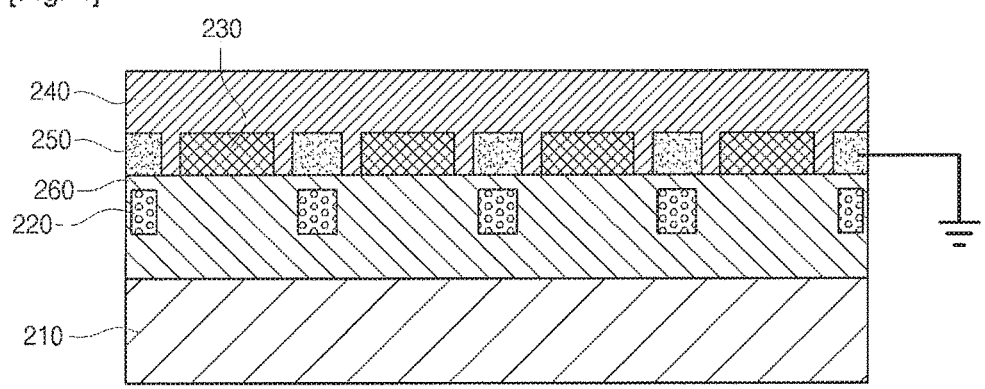

[Fig. 5]
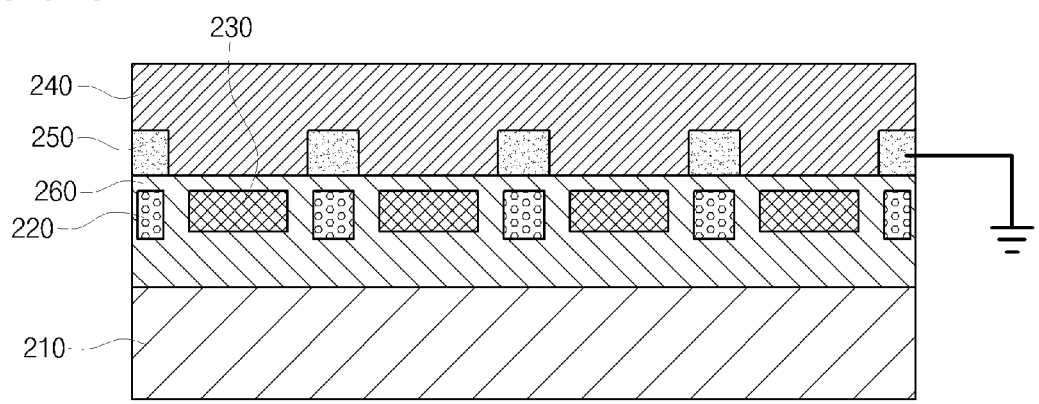
[Fig. 6]
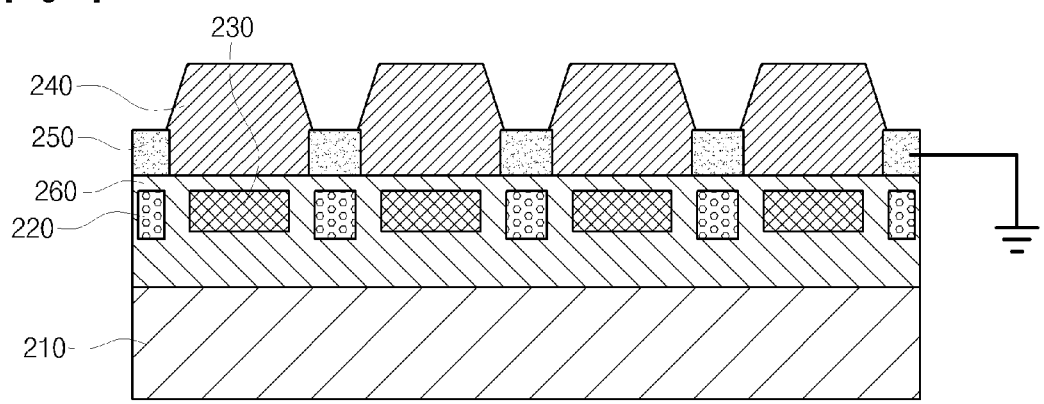

[Fig. 7]
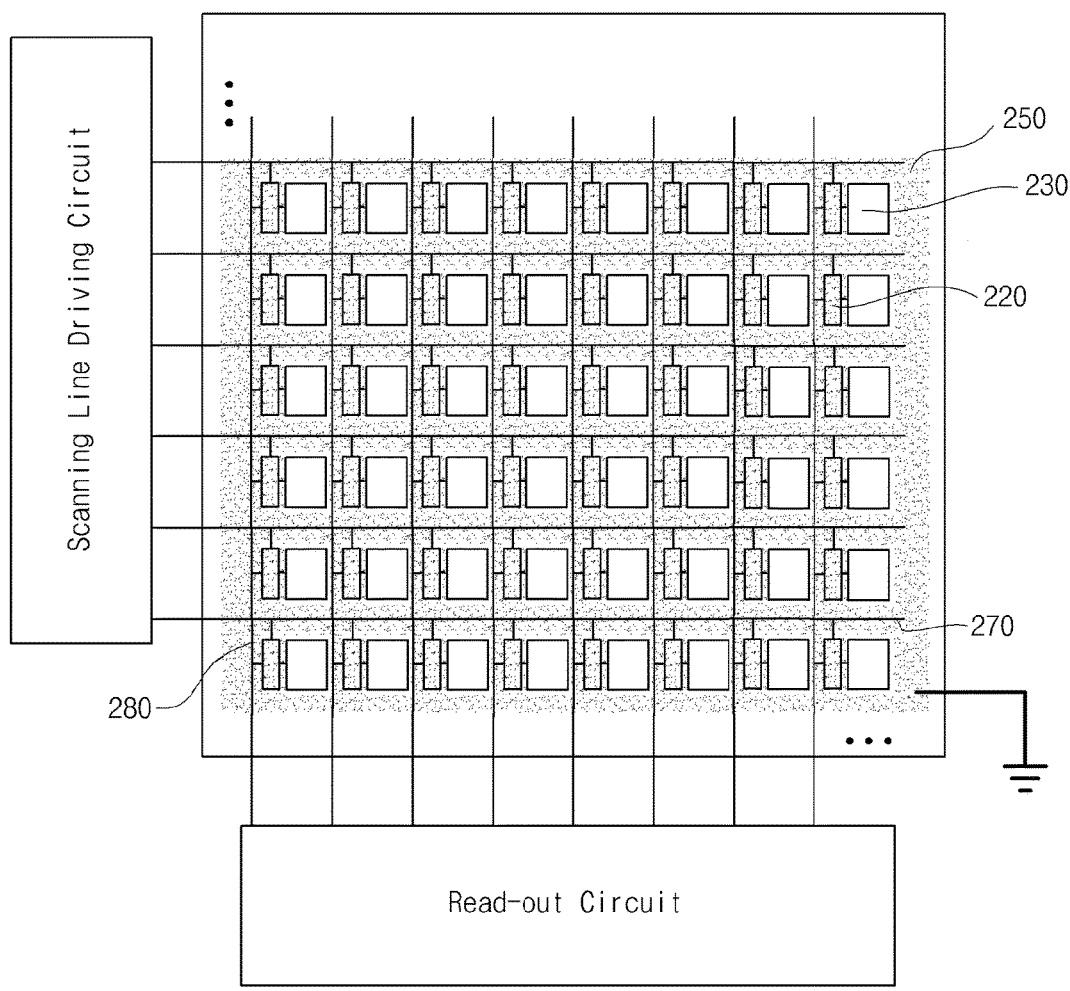

[Fig. 8]
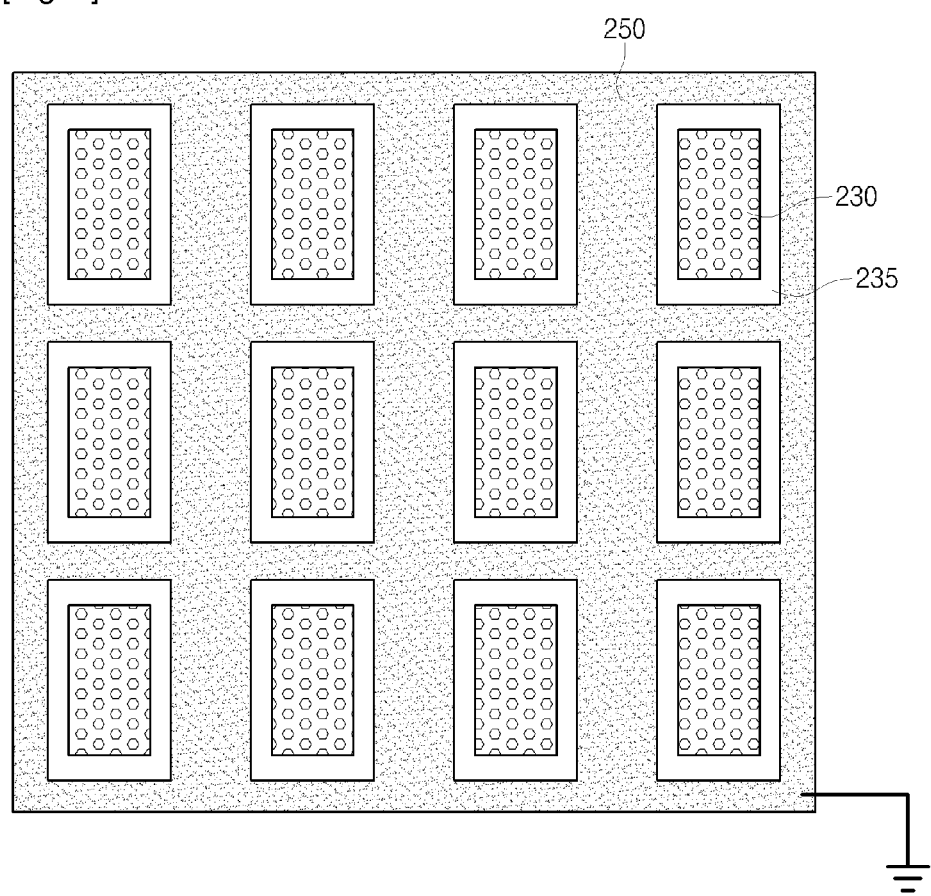

_US 9,811,712 B2_

INTENSIFIED SENSOR ARRAY FOR STATIC ELECTRICITY

TECHNICAL FIELD

The present invention relates to a intensified sensor array for static electricity, more particularly, to a intensified sensor array in which a static electricity preventing wiring is formed on an upper part of a pixel circuit to thereby prevent transistors or signal wirings, which constitute the pixel circuit, from being damaged or being deteriorated in function due to static electricity.

BACKGROUND ART

In general, in the case of a sensor array, particularly, a capacitive fingerprint sensor array, when a fingerprint touches a protective film above a pixel electrode (sensing electrode), a difference between capacitances is generated depending on fingerprint unevenness, and a pixel circuit detects the difference to thereby recognize the fingerprint.

In the fingerprint sensor array, when the fingers touch the protective layer above the pixel electrode (sensing electrode), static electricity charged in the human body is discharged to the pixel electrode (sensing electrode), and due to the static electricity, a problem that the pixel circuit is momentarily damaged or is deteriorated in function can be generated.

To solve this, in the past, a method in which in order to protect the pixel electrode, the static electricity preventing wiring is located higher than the pixel electrode was used. However, the conventional method has a problem in that the pixel circuit of a lower part of the pixel electrode is destroyed due to the static electricity or the operation property of transistors is deteriorated.

As illustrated in FIG. 1, FIG. 2 and FIG. 3, the structure of the conventional sensor array is formed of a substrate 110, a pixel circuit 120, a pixel electrode (a sensing electrode) 130, and a protective layer 140. In general, the pixel circuit 120 is formed of transistors and has the pixel electrode (sensing electrode) 130 at its upper end to thereby transmit a signal (a difference between capacitances) to the pixel circuit 120. In such a structure, signal wirings or the pixel circuit 120 which exists in a lower part of the pixel electrode 130 has a small effect in that it can be protected by a static electricity wiring 150 and high probability that it can be damaged by the static electricity.

Furthermore, in the structure of the conventional sensor array, the static electricity preventing wiring 150 should be located high enough to prevent the static electricity. For this, the static electricity preventing wiring 150 should be formed as a new construction having a different height from the pixel electrode 130. Accordingly, the structure of the conventional sensor array is disadvantageous that a manufacturing process cost increases.

DISCLOSURE OF INVENTION

Technical Problem

The present invention provides a sensor array having a structure in which a static electricity preventing wiring covers an upper surface of a pixel circuit to thereby prevent static electricity, and thus when static electricity of a high voltage is momentarily generated, the static electricity induced through the static electricity preventing wiring is discharged so that signal wirings and the pixel circuit of a lower part can be effectively protected from the static electricity.

Solution to Problem

A intensified sensor array for static electricity according to an exemplary embodiment of the present invention may include: a substrate; an insulating layer stacked on the substrate and including a pixel circuit; and a pixel electrode connected to the pixel circuit, wherein the pixel circuit and the pixel electrode are disposed not to overlap each other.

A intensified sensor array for static electricity according to another exemplary embodiment of the present invention may further include a static electricity preventing wiring which is disposed on an upper part of the pixel circuit to thereby induce and discharge static electricity to the outside of pixel area or sensing area.

The pixel electrode according to still another exemplary embodiment of the present invention may be disposed to be spaced apart from the static electricity preventing wiring so that they are electrically separated from each other.

The pixel electrode according to still another exemplary embodiment of the present invention may be disposed on an upper plane of the insulating layer.

The pixel electrode according to still another exemplary embodiment of the present invention may be disposed in a structure embedded in the insulating layer.

The pixel electrode according to still another exemplary embodiment of the present invention may be disposed on the same horizontal plane as the pixel circuit within the insulating layer.

The pixel circuit according to still another exemplary embodiment of the present invention may be formed of a thin film transistor.

An active layer of the thin film transistor according to still another exemplary embodiment of the present invention may be formed of one among amorphous silicon, polycrystalline silicon and an oxide semiconductor.

The static electricity preventing wiring according to still another exemplary embodiment of the present invention may be disposed on the upper plane of the insulating layer.

The static electricity preventing wiring according to still another exemplary embodiment of the present invention may be disposed in a corresponding position where it overlaps the pixel circuit.

Electric potential of the static electricity preventing wiring according to still another exemplary embodiment of the present invention may be consistently fixed.

The static electricity preventing wiring according to still another exemplary embodiment of the present invention may be formed in a grid shape which surrounds a side surface of the pixel electrode consisting of an array at periodic intervals.

The static electricity preventing wiring according to still another exemplary embodiment of the present invention may be formed of one of a metal, a metal oxide and a conductive organic material.

The sensor array according to still another exemplary embodiment of the present invention may further include a protective layer stacked on an upper part of the static electricity preventing wiring.

The static electricity preventing wiring according to still another exemplary embodiment of the present invention may be formed less than a height of the protective layer.

The protective layer according to still another exemplary embodiment of the present invention may be patterned so that the static electricity preventing wiring is exposed.

The substrate according to still another exemplary embodiment of the present invention may be a substrate in which an insulating substrate or a metal substrate is coated with an insulating film.

The protective layer according to still another exemplary embodiment of the present invention may be formed in a thickness range of 0.2 μm to 10 μm.

Advantageous Effects of Invention

In accordance with the exemplary embodiments of the present invention, the intensified sensor array for static electricity is configured in a structure in which the pixel electrode is disposed not to cover the pixel circuit or the signal wirings, and the static electricity preventing wiring covers an upper surface of the signal wirings and the pixel circuit to thereby prevent static electricity, so when static electricity of a high voltage is monetarily generated, the static electricity is discharged through the static electricity preventing wiring, thereby being capable of effectively protecting the pixel circuit of the lower part from the static electricity.

Furthermore, in accordance with the exemplary embodiments of the present invention, it would be unnecessary to form the static electricity preventing wirings so as to have different heights from each other. Also, the static electricity preventing wiring can be formed on the substrate of the thin film transistor using an already used metal layer without an additional construction, thereby being capable of reducing a manufacturing process cost.

BRIEF DESCRIPTION OF DRAWINGS

The above and other aspects, features and advantages of certain exemplary embodiments of the present invention will be more apparent from the following description taken in conjunction with the accompanying drawings, in which:

FIG. 1, FIG. 2, and FIG. 3 are views illustrating a sensor array according to a conventional art.

FIG. 4, FIG. 5, and FIG. 6 are cross-sectional views illustrating a intensified sensor array for static electricity according to an exemplary embodiment of the present invention.

FIG. 7 and FIG. 8 are plane views illustrating a intensified sensor array for static electricity according to another exemplary embodiment of the present invention.

| (Reference Numerals) | |
|---|---|
| 210: Substrate | 220: Pixel Circuit |
| 230: Pixel Electrode | 240: Protective Layer |
| 250: Static Electricity Preventing Wiring | |
| 260: Insulating Layer | |
| 270, 280: Signal Wirings | |

BEST MODE FOR CARRYING OUT THE INVENTION

Exemplary embodiments according to the present invention will now be described more fully hereinafter with reference to the accompanying drawings. This invention may, however, be embodied in different forms and should not be construed as limited to the exemplary embodiments set forth herein. Like numbers presented in the drawings refer to like elements throughout the specification.

FIG. 4, FIG. 5 and FIG. 6 are cross-sectional views illustrating a intensified sensor array for static electricity according to an exemplary embodiment of the present invention. FIG. 4 is a view illustrating a intensified sensor array for static electricity which is configured such that a static electricity wiring is located on the same plane as a pixel electrode.

The gist of the present invention is to provide a sensor array including: a substrate; an insulating layer stacked on the substrate and including a pixel circuit; and a pixel electrode connected to the pixel circuit, wherein the pixel circuit and the pixel electrode are disposed not to overlap each other, and a static electricity preventing wiring overlaps the pixel circuit and signal wirings, thereby realizing a performance which is resistant to static electricity.

The gist of the contents as described above will be explained with reference to the illustrated drawings. As illustrated in FIG. 4, the intensified sensor array for static electricity according to the exemplary embodiment of the present invention may include: a substrate 210; a pixel circuit 220; a protective layer 240; a static electricity wiring 250; and an insulating layer 260. In particular, in this case, the pixel circuit and the pixel electrode may be disposed not to overlap each other. The static electricity preventing wiring may be disposed to overlap the pixel circuit. In the present invention, overlapping is defined as including a disposition structure in which dispositions on a plane do not overlap each other when seen from a perpendicular direction. That is, like the disposition of FIG. 4, the pixel circuit 220 and the pixel electrode 230 are disposed so that there is no overlapping part in the perpendicular direction, and thus a structure which the overlapping is not generated is provided. Of course, in a preferred exemplary embodiment of the present invention, the overlapping is defined as a disposition structure in which dispositions overlap each other. However, the structure, in which plane dispositions of each configuration do not completely overlap each other in a side surface or an end surface, but partially overlap each other, is also included in the definition, which included in the gist of the present invention, and in which dispositions do not overlap each other.

In accordance with the exemplary embodiment of the present invention, the intensified sensor array for static electricity may be disposed in a structure in which the pixel circuit 220 is formed on the substrate 210, the insulating layer 260 is formed on an upper part of the pixel circuit 220, and the static electricity preventing wiring 250 is formed an upper part of the insulating layer 260. Of course, this disposition structure is one exemplary embodiment. Various modified exemplary embodiments having disposition structures such as a disposition structure in which the pixel circuit and the pixel electrode do not overlap each other, and a disposition structure in which the static electricity preventing wiring does not overlap the pixel circuit may be certainly included in the gist of the present invention.

The substrate 210 is formed by coating an insulating substrate or a metal substrate with an insulating film, and the pixel circuit 220 consisting of a thin film transistor is formed on the substrate 210. At this time, an active layer of the thin film transistor may be formed of one among amorphous silicon, polycrystalline silicon and an oxide semiconductor.

The pixel electrode 230 is connected to the pixel circuit 220. Furthermore, the pixel electrode 230 is formed on the substrate 210 in an array structure.

The static electricity preventing wiring 250 is electrically separated from the pixel electrode 230. Like this, because the static electricity preventing wiring 250 is electrically separated from the pixel electrode 230, static electricity generated is induced into the static electricity preventing wiring 250, and thus the pixel electrode 230 can be protected from the static electricity.

That is, in accordance with the exemplary embodiment illustrated in FIG. 4, the pixel electrode 230 may be disposed in a position where it does not cover the pixel circuit 220 and the signal wirings 270 and 280, and the static electricity preventing wiring 250 may be disposed in a structure in which it covers the upper plane of the pixel circuit 220 with the insulating layer 260 interposed therebetween. Accordingly, because the static electricity is induced into the static electricity preventing wiring 250 and discharged to the outside of pixel area or sensing area, so the pixel circuit 220 and the signal wirings 270 and 280 can be protected from the static electricity.

Explaining more specifically, when a user's touch is carried out, static electricity generated due to the touch is induced into the static electricity preventing wiring 250, and thus the pixel circuit 220 located in a lower part of the static electricity preventing wiring 250 is not affected by the generated static electricity as the static electricity is induced into the static electricity preventing wiring.

Like this, the static electricity preventing wiring 250 and the pixel electrode 230 may be formed on the same plane as each other. Moreover, the static electricity preventing wiring 250 may be formed of one of a metal and a metal oxide, or a conductive organic material.

Meanwhile, the protective layer 240 may be formed an upper part of the pixel electrode 230 and the static electricity preventing wiring 250 to thereby protect the static electricity preventing wiring 250 and the pixel electrode 230. In this case, the protective layer may be formed of an organic membrane or an inorganic membrane having a thickness in a range of 0.2 μm to 10 μm. In a case where the thickness of the protective layer is less than 0.2 μm, the effect for preventing the static electricity decreases. In a case where the thickness of the protective layer is more than 10 μm, the effect for preventing the static electricity increases, but this may occur problems in that a distance between the pixel electrode (sensing electrode) and a fingerprint increases, and sensing sensitivity decreases due to an increase in a parasitic capacitance. Accordingly, the protective layer may be formed in the thickness of 0.2 μm to 10 μm which satisfies the two conditions and is an adequate thickness.

Another exemplary embodiment of the sensor array according to an exemplary embodiment of the present invention which is explained with reference to FIG. 4 is hereinafter explained.

Referring to FIG. 5, FIG. 5 is a view illustrating a intensified sensor array for static electricity which is configured such that the static electricity wiring is located on an upper plane which is higher than the pixel electrode.

As illustrated in FIG. 5 and like the exemplary embodiment of FIG. 4, the intensified sensor array for static electricity may include: the substrate 210; the pixel circuit 220; the protective layer 240; the static electricity wiring 250; and the insulating layer 260. In this case, particularly, the pixel electrode 230 and the pixel circuit 220 may be disposed in a structure embedded in the insulating layer so as to have a disposition structure in which they do not overlap each other.

That is, the pixel circuit 220 consisting of the thin film transistor is formed on the substrate 210, the pixel electrode 230 is connected to the pixel circuit 220, and the static electricity preventing wiring 250 is electrically separated from the pixel electrode 230.

Furthermore, the static electricity preventing wiring 250 is disposed to cover the upper plane of the pixel circuit 220 with the insulating layer 260 interposed therebetween, and thus static electricity is induced into the static electricity preventing wiring 250 so that the pixel electrode 230 can be protected from the static electricity.

In addition, in the exemplary embodiment as illustrated in FIG. 5, the pixel electrode 230 may be formed on the same plane as the pixel circuit 220.

That is, the static electricity preventing wiring 250 may be formed in a structure in which it covers the upper part of the signal wirings and the pixel circuit 220, and the pixel electrode 230 may be located on the same plane as the pixel circuit 220 other than on the same plane as the static electricity preventing wiring 250. Accordingly, the static electricity preventing wiring 250 may be located on the upper plane which is higher than the pixel electrode 230.

Accordingly, in accordance with the exemplary embodiment as illustrated in FIG. 5, the static electricity preventing wiring 250 is located on the upper part which is relatively higher than the pixel circuit 220 and the pixel electrode 230, and thus static electricity is more effectively induced into the static electricity preventing wiring 250, so that the static electricity is not transmitted to the pixel circuit 220 and the pixel electrode 230.

FIG. 6 illustrates a configuration of another exemplary embodiment according to the present invention.

This exemplary embodiment is characterized in that when the protective layer is formed on the insulating layer, the protective layer is implemented in a patterning structure.

That is, the drawing illustrates the intensified sensor array for static electricity which is configured such that the static electricity preventing wiring 250 is located on the upper plane which is higher than the pixel electrode 230, and the protective layer 240 of the upper part of the static electricity preventing wiring is selectively etched.

That is, in the exemplary embodiment of FIG. 6, the protective layer 240 is formed on the upper part of the static electricity preventing wiring 250, and in the protective layer 240, an upper part of the protective layer 240 corresponding to the static electricity preventing wiring 250 is etched so that the static electricity preventing wiring 250 may be patterned to be exposed. Hereinafter, the pattern of the protective layer is defined as "an exposure pattern".

In accordance with the configuration of the exposure pattern, when the protective layer 240 is etched, static electricity can be more easily induced into the static electricity preventing wiring 250, and therefore, the static electricity generated by a user's touch is more easily induced into the static electricity preventing wiring 250.

Like this, the static electricity preventing wiring 250 is exposed to the upper part through the etched part, so the static electricity generated by the human finger's touch is more effectively induced into the static electricity preventing wiring 250.

The protective layer according to the aforesaid exemplary embodiment of the present invention may have a thickness in a range of 0.2 μm to 10 μm.

FIG. 7 and FIG. 8 are plane views illustrating a intensified sensor array for static electricity according to still another exemplary embodiment.

As illustrated in FIG. 7, the static electricity preventing wiring 250 may be formed in a grid shape throughout an entire surface of the sensor array. Like this, the static electricity preventing wiring 250 formed in the grid shape may be formed in a structure in which it covers the upper part of the pixel circuit 220 consisting of the signal wirings 260 and 270 and the transistors.

Like this, because the static electricity preventing wiring 250 is disposed to cover the upper surface of the pixel circuit 220 and the signal wirings 260 and 270, the signal wirings 260 and 270 or the pixel circuit 220 can be effectively protected from the static electricity.

Furthermore, as illustrated in FIG. 8, the static electricity preventing wiring 250 may be disposed in the grid shape which surrounds around the pixel electrode 230 at periodic intervals 235.

Like this, the static electricity preventing wiring 250 may be electrically separated from the pixel electrode 230.

Accordingly, by forming the intensified sensor array for static electricity having the structure in which the static electricity preventing wiring 250 covers the upper surface of the pixel circuit to thereby prevent the static electricity, even in a case that the static electricity of a high voltage is momentarily generated, the static electricity induced through the static electricity preventing wiring 250 is discharged, thereby effectively protecting the pixel circuit 220 of the lower part from the static electricity.

As previously described, in the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims and their equivalents.

The invention claimed is:

1. A intensified sensor array for static electricity, comprising:
    a substrate;
    an insulating layer stacked on the substrate and including a pixel circuit; and
    a pixel electrode connected to the pixel circuit,
    wherein the pixel circuit and the pixel electrode are disposed not to overlap each other.

2. The sensor array of claim 1, further comprising a static electricity preventing wiring which is disposed on an upper part of the pixel circuit to thereby induce and discharge static electricity to the outside of pixel area or sensing area.

3. The sensor array of claim 2, wherein the pixel electrode is disposed to be spaced apart from the static electricity preventing wiring so that they are electrically separated from each other.

4. The sensor array of claim 3, wherein the pixel electrode is disposed on an upper plane of the insulating layer.

5. The sensor array of claim 3, wherein the pixel electrode is disposed in a structure embedded in the insulating layer.

6. The sensor array of claim 5, wherein the pixel electrode is disposed on the same horizontal plane as the pixel circuit within the insulating layer.

7. The sensor array of claim 3, wherein the pixel circuit is formed of a thin film transistor.

8. The sensor array of claim 7, wherein an active layer of the thin film transistor is formed of one among amorphous silicon, polycrystalline silicon, and an oxide semiconductor.

9. The sensor array of claim 2, wherein the static electricity preventing wiring is disposed on the upper plane of the insulating layer.

10. The sensor array of claim 9, wherein the static electricity preventing wiring is disposed in a corresponding position where it overlaps the pixel circuit.

11. The sensor array of claim 9, wherein electric potential of the static electricity preventing wiring is consistently fixed.

12. The sensor array of claim 9, wherein the static electricity preventing wiring is formed in a grid shape which surrounds a side surface of the pixel electrode consisting of an array at periodic intervals.

13. The sensor array of claim 9, wherein the static electricity preventing wiring is formed of one among a metal, a metal oxide and a conductive organic material.

14. The sensor array of claim 2, further comprising a protective layer stacked on an upper part of the static electricity preventing wiring.

15. The sensor array of claim 14, wherein the static electricity preventing wiring is formed less than a height of the protective layer.

16. The sensor array of claim 14, wherein the protective layer is patterned so that the static electricity preventing wiring is exposed.

17. The sensor array of claim 14, wherein the substrate is a substrate in which an insulating substrate or a metal substrate is coated with an insulating film.

18. The sensor array of claim 15, wherein the protective layer has a thickness in a range of 0.2 µm to 10 µm.

* * * * *